(12) United States Patent
Kim et al.

(10) Patent No.: US 10,354,967 B2
(45) Date of Patent: Jul. 16, 2019

(54) METAL PILLAR IN A FILM-TYPE SEMICONDUCTOR PACKAGE

(71) Applicant: Samsung Electronics Co., Ltd., Suwon-si, Gyeonggi-do (KR)

(72) Inventors: Jung-woo Kim, Osan-si (KR); Woon-bae Kim, Seoul (KR); Bo-in Noh, Suwon-si (KR); Go-woon Seong, Hwaseong-si (KR); Ji-yong Park, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/456,882

(22) Filed: Mar. 13, 2017

(65) Prior Publication Data

US 2018/0090459 A1 Mar. 29, 2018

(30) Foreign Application Priority Data

Sep. 29, 2016 (KR) .................. 10-2016-0125590

(51) Int. Cl.
*H01L 23/48* (2006.01)
*H01L 21/44* (2006.01)
*H01L 23/00* (2006.01)

(52) U.S. Cl.
CPC .............. *H01L 24/13* (2013.01); *H01L 24/05* (2013.01); *H01L 24/08* (2013.01); *H01L 24/81* (2013.01); *H01L 2224/0401* (2013.01); *H01L 2224/05558* (2013.01); *H01L 2224/05573* (2013.01); *H01L 2224/05584* (2013.01); *H01L 2224/13111* (2013.01); *H01L 2224/13144* (2013.01); *H01L 2224/13147* (2013.01); *H01L 2224/13166* (2013.01); *H01L 2224/13611* (2013.01); *H01L 2224/13644* (2013.01); *H01L 2224/13647* (2013.01); *H01L 2224/13655* (2013.01); *H01L 2224/16225* (2013.01); *H01L 2224/16502* (2013.01); *H01L 2224/32225* (2013.01); *H01L 2224/73204* (2013.01);
(Continued)

(58) Field of Classification Search
CPC ......... H01L 24/13; H01L 24/05; H01L 24/08; H01L 24/81
See application file for complete search history.

(56) References Cited

U.S. PATENT DOCUMENTS

| 6,049,130 | A | 4/2000 | Hosomi et al. |
| 6,495,397 | B2 | 12/2002 | Kubota et al. |
| 6,731,003 | B2 | 5/2004 | Joshi et al. |

(Continued)

FOREIGN PATENT DOCUMENTS

| JP | 3746719 B2 | 2/2006 |
| KR | 10-0503411 B1 | 7/2005 |
| KR | 10-1169687 B1 | 8/2012 |

*Primary Examiner* — Alonzo Chambliss
(74) *Attorney, Agent, or Firm* — Harness, Dickey & Pierce, P.L.C.

(57) ABSTRACT

A film-type semiconductor package includes a metal lead portion arranged on a film substrate, a semiconductor chip including a pad, and a bump connecting the metal lead portion to the pad of the semiconductor chip. The bump includes a metal pillar arranged on the pad and including a first metal and a soldering portion arranged on an entire surface of the metal pillar, bonded to the metal lead portion, and including the first metal and a second metal that is different from the first metal.

17 Claims, 12 Drawing Sheets

(52) U.S. Cl.
CPC ........... *H01L 2224/81193* (2013.01); *H01L 2224/81805* (2013.01); *H01L 2924/19105* (2013.01)

(56) References Cited

U.S. PATENT DOCUMENTS

| | | | |
|---|---|---|---|
| 7,008,867 B2 * | 3/2006 | Lei | H01L 24/03 257/E21.508 |
| 7,749,888 B2 | 7/2010 | Nishiyama et al. | |
| 8,148,819 B2 | 4/2012 | Ohnishi | |
| 8,492,891 B2 | 7/2013 | Lu et al. | |
| 8,592,995 B2 | 11/2013 | Lin et al. | |
| 9,082,933 B2 | 7/2015 | Lee et al. | |
| 9,685,372 B2 * | 6/2017 | Hwang | H01L 21/7688 |
| 2004/0251546 A1 | 12/2004 | Lee et al. | |
| 2007/0273025 A1 | 11/2007 | Bellaiche | |
| 2010/0206602 A1 | 8/2010 | Lee et al. | |
| 2012/0012997 A1 * | 1/2012 | Shen | H01L 23/49816 257/737 |
| 2013/0056869 A1 * | 3/2013 | Kuo | H01L 24/11 257/737 |
| 2014/0346672 A1 * | 11/2014 | Lin | H01L 24/11 257/737 |
| 2015/0318254 A1 | 11/2015 | Thacker et al. | |

* cited by examiner

METAL PILLAR IN A FILM-TYPE SEMICONDUCTOR PACKAGE

CROSS-REFERENCE TO RELATED APPLICATION

This application claims the benefit of priority from Korean Patent Application No. 10-2016-0125590, filed on Sep. 29, 2016, in the Korean Intellectual Property Office, the disclosure of which is incorporated herein in its entirety by reference.

BACKGROUND

The inventive concepts relate to a film-type semiconductor package and a manufacturing method thereof, and/or to a film-type semiconductor package using a film substrate and a manufacturing method thereof.

A film-type semiconductor package, e.g., a chip on film (COF) semiconductor package, is typically manufactured by bonding a bump arranged on a pad of a semiconductor chip and a metal lead portion arranged on a film substrate.

Along with the trend toward miniaturization, slimness, lighter weight, and high performance of electronic devices, the bump typically present in a film-type semiconductor package has become increasingly finer. Accordingly, a reliable bonding process may be advantageous when applied between the bump and the metal lead portion when the film-type semiconductor package is manufactured. In addition, when the bump and the metal lead portion are bonded to each other, bending of the film substrate while the bump is bonded to the metal lead portion may be reduced.

SUMMARY

The inventive concepts relate to a film-type semiconductor package capable of reducing bending of a film substrate and more reliably bonding a bump and a metal lead portion to each other.

The inventive concepts relate to a method of manufacturing the film-type semiconductor package.

According to an example embodiment of the inventive concepts, a film-type semiconductor package includes a metal lead portion arranged on a film substrate, a semiconductor chip including a pad, and a bump connecting the metal lead portion and the pad of the semiconductor chip. The bump may include a metal pillar on the pad and a first metal, and a soldering portion on an entire surface of the metal pillar, bonded to the metal lead portion, and including the first metal and a second metal different from the first metal.

According to another example embodiment of the inventive concepts, a film-type semiconductor package includes a metal lead portion extending from an outer lead bonding portion at one side portion of a film substrate to an inner lead bonding portion, a semiconductor chip including a pad, and a bump connecting the metal lead portion of the inner lead bonding portion and the pad of the semiconductor chip. The bump may include a metal pillar on the pad and a first metal, and a soldering portion on an entire surface of the metal pillar, bonded to the metal lead portion, and may include the first metal and a second metal different from the first metal.

According to another example embodiment of the inventive concepts, a film-type semiconductor package includes a metal lead portion on a film substrate and including a copper layer, a semiconductor chip including a pad, and a bump connecting the metal lead portion and the pad of the semiconductor chip. The bump may include a metal pillar on the pad and a gold layer or a copper layer, and a soldering portion on an entire surface of the metal pillar, may include a gold-tin eutectic alloy layer, and may be bonded to the metal lead portion.

According to another example embodiment of the inventive concepts, a method of manufacturing a film-type semiconductor package includes forming a film substrate including a metal lead portion, forming a metal pillar on a pad of a semiconductor chip, forming a first solder layer on the metal pillar, forming a second solder layer on the first solder layer to form a preliminary bump including the metal pillar, the first solder layer, and the second solder layer, and thermally compressing the metal lead portion and the first and second solder layers of the preliminary bump to form a bump including a soldering portion that bonds the metal lead portion to the pad of the semiconductor chip.

Some example embodiments relate to a bonding bump bonded to a lead portion in a semiconductor package, the bonding bump including a metal pillar including a first metal, and a soldering portion including a first soldering layer on the metal pillar, the soldering portion being bonded to the metal lead portion and including a eutectic alloy layer of the first metal.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Hereinafter, example embodiments will be explained in detail with reference to the accompanying drawings.

When the terms "about" or "substantially" are used in this specification in connection with a numerical value, it is intended that the associated numerical value include a tolerance of ±10% around the stated numerical value. Moreover, when reference is made to percentages in this specification, it is intended that those percentages are based on weight, e.g., weight percentages. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure. Although the tubular elements of the embodiments may be cylindrical, other tubular cross-sectional forms are contemplated, such as square, rectangular, oval, triangular and others.

A film-type semiconductor package, e.g., a chip-on-film semiconductor package, may be applied to a mobile terminal device, a laptop computer, or a display device, e.g., a flat panel display device. Since the display device is driven by a semiconductor chip including input/output terminals configured to perform various functions and has become thinner, the film-type semiconductor package may be applied to the display device.

Hereinafter, for the convenience of explanation, the film-type semiconductor package applied to the semiconductor chip, e.g., a display drive IC (integrated circuit) included in the display device, will be described as a representative example. The display drive IC may be referred to as a "display driver IC".

Figure 1:
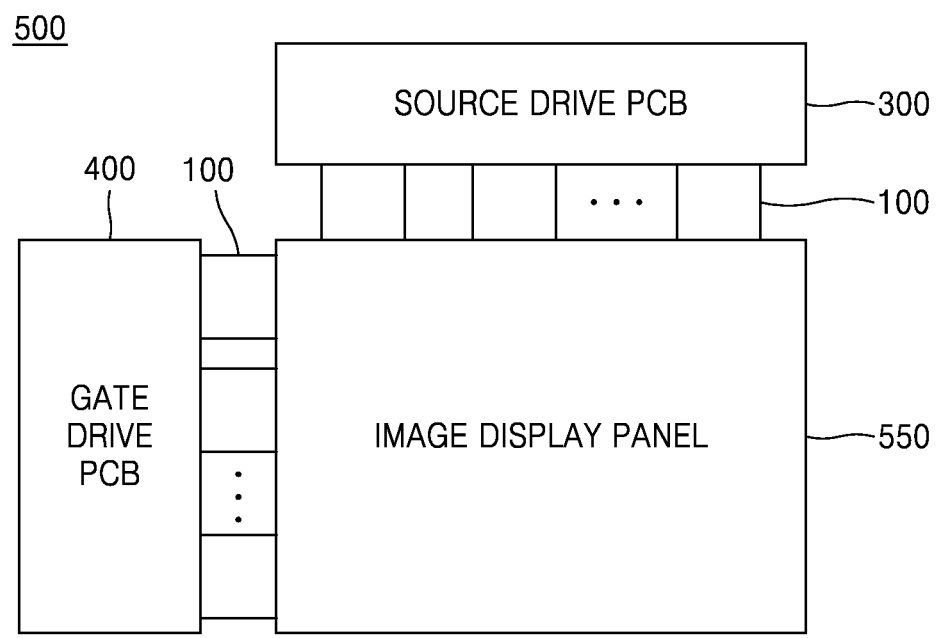
FIG. 1 is a block diagram illustrating a display device employing a film-type semiconductor package according to an example embodiment.

FIG. 1 is a block diagram illustrating a display device 500 employing a film-type semiconductor package according to an example embodiment.

In detail, the display device 500 may include the film-type semiconductor package 100, a source drive printed circuit board (PCB) 300, a gate drive PCB 400, and an image display panel 550.

The source drive PCB 300 and the gate drive PCB 400 may provide a signal to the image display panel 550 to allow an image to be displayed through each, or at least one, pixel of the image display panel 550. The image display panel 550 may display the image on the basis of the signal applied thereto.

The chip-on-film semiconductor package may be used as the film-type semiconductor package 100. The film-type semiconductor package 100 may receive the signal output from the source driver PCB 300 and the gate driver PCB 400 and transmit the received signal to the image display panel 550.

Figure 2:
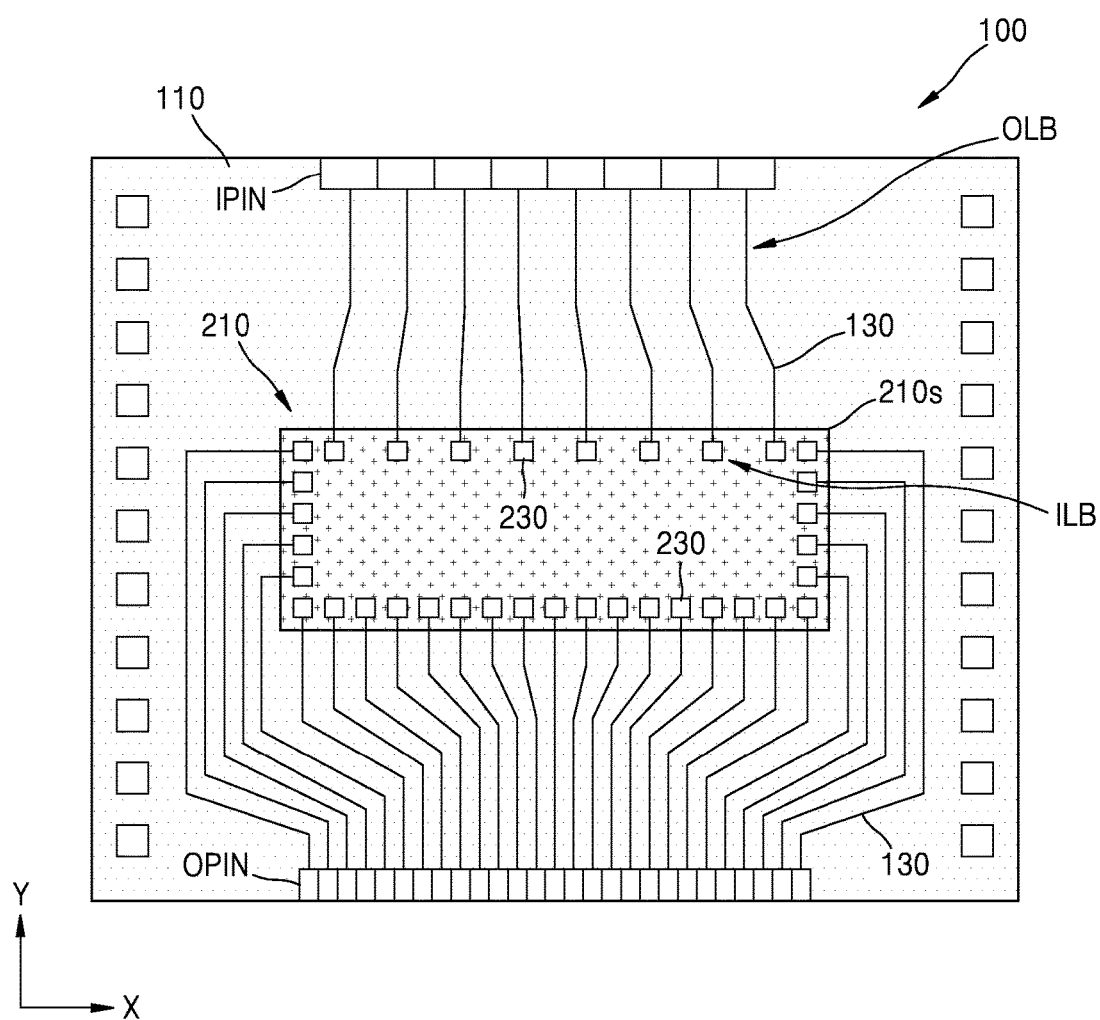
FIG. 2 is a plan view schematically illustrating a film-type semiconductor package according to an example embodiment.
Figure 3:
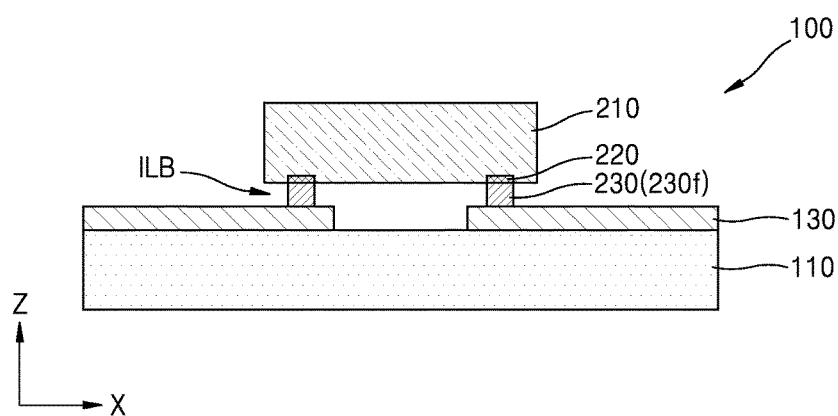
FIG. 3 is a cross-sectional view illustrating a connection between a semiconductor chip and a film substrate of the film-type semiconductor package of FIG. 2.

FIG. 2 is a plan view schematically illustrating a film-type semiconductor package according to an example embodiment, and FIG. 3 is a cross-sectional view illustrating a connection between a semiconductor chip and a film substrate of the film-type semiconductor package of FIG. 2.

In detail, the film-type semiconductor package 100 may include a film substrate 110, a metal lead portion 130, a semiconductor chip 210, and a bump 230. An output pin OPIN is arranged at one end portion of the film substrate 110, and an input pin IPIN is arranged at the other end portion of the film substrate 110.

The film substrate 110 may be, but not limited to, a polyimide substrate. The metal lead portion 130 may include a copper layer. As described later, the metal lead portion 130 may include a metal lead, e.g., a copper layer, and a lead protective layer, e.g., a tin layer, protecting the copper layer. The film substrate 110 and the metal lead portion 130 may be referred to as a "film member". The film substrate 110 and the metal lead portion 130 may be referred to as a "tape carrier".

The film-type semiconductor package 100 may include the semiconductor chip 210 provided with a pad 220 arranged in one surface of the semiconductor chip 210, and the bump 230 arranged on the pad 220 of the semiconductor chip 210. The semiconductor chip 210 may be mounted on the film substrate 110. The semiconductor chip 210 may be provided in a package form, and thus the semiconductor chip 210 may be a semiconductor package.

The pad 220 may include, for example, a copper layer or an aluminum layer but is not limited thereto. The pad 220 of the semiconductor chip 210 may be an edge pad arranged at a circumferential portion of a chip body 210s. The pad 220, if necessary, may be a center pad arranged at a center portion of the chip body 210s. The number or arrangement of the pads 220 may be implemented in a variety of ways according to a design applied to the film-type semiconductor package 100. The pad 220 may include a power pad, a ground pad, and a signal input/output pad.

The film-type semiconductor package 100 may be formed by bonding the bump 230 arranged on the one surface of the semiconductor chip 210 to the metal lead portion 130 arranged on the film substrate 110. The bump 230 and the metal lead portion 130 may be bonded to each other by a thermal compression process as described below.

The bump 230 may be arranged on an active surface of the semiconductor chip 210, e.g., on a surface on which a circuit is formed. The bump 230 may protrude from the active surface of the semiconductor chip. The bump 230 may be arranged on a lower surface of the chip body 210s. The bump 230 may be arranged at a circumferential portion of the semiconductor chip 210. The bump 230 may be arranged at a center portion of the semiconductor chip 210 according to a position of the pad 220.

The semiconductor chip 210 and the metal lead portion 130 may be electrically connected to each other through the bump 230 that is located on the one surface of the semiconductor chip 210 of the film-type semiconductor package 100.

The metal lead portion 130 may be electrically connected to the input and output pins IPIN and OPIN on the film substrate 110. The pad 220 of the semiconductor chip 210 may be connected to the metal lead portion 130 that is located on the film substrate 110 through the bump 230. The metal lead portion 130 may be arranged on the film substrate 110 in a variety of ways according to a design applied to the film-type semiconductor package 100. The pad 220 may be electrically connected to the input and output pins IPIN and OPIN through the bump 230 and the metal lead portion 130.

The metal lead portion 130 may include an outer lead bonding portion OLB and an inner lead bonding portion ILB. The metal lead portion 130 may extend to the inner lead bonding portion ILB from the outer lead bonding portion OLB at one side portion of the film substrate 110.

The inner lead bonding portion ILB may be a portion at which the semiconductor chip 210 is bonded to the film substrate 110. The outer lead bonding portion OLB may be a portion at which the image display panel 550 (refer to FIG. 1) is bonded to the source and gate drive PCBs 300 and 400 (refer to FIG. 1).

Along with the trend toward miniaturization, slimness, lighter weight, and high performance of electronic devices, the number of pads 220 and bumps 230 can be increased. The film-type semiconductor package 100 may advantageously have high reliability of the bonding between the bump 230 that is located on the one surface of the semiconductor chip 210 and the metal lead portion 130 that is located on the film substrate 110. In addition, it may be advantageous that the bonding process of the bump 230 and the metal lead portion 130 in the film-type semiconductor package 100 is easily performed, and that the film substrate 110 is not bent.

Accordingly, the film-type semiconductor package 100 may include the bump 230 having a soldering portion 230f so as to improve the bonding reliability and hinder or prevent the film substrate 110 from being bent. The structure and material of the bump 230 will be described in more detail below.

Figure 4:
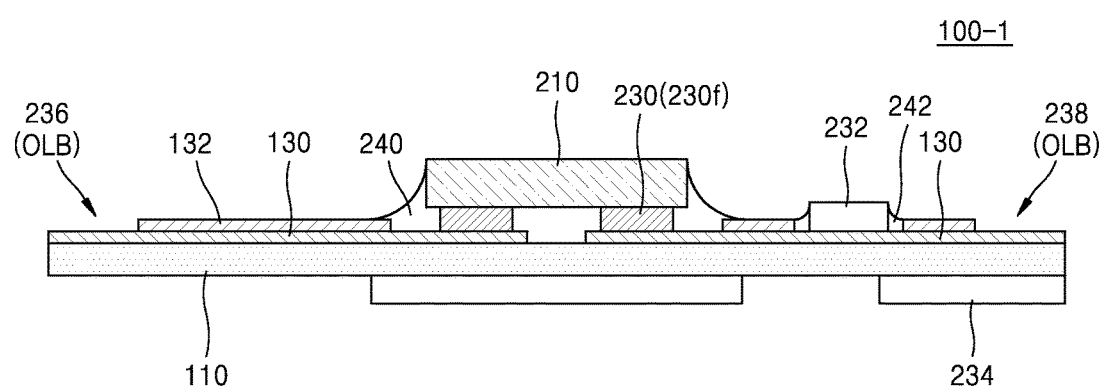
FIG. 4 is a cross-sectional view illustrating a film-type semiconductor package according to an example embodiment.

FIG. 4 is a cross-sectional view illustrating a film-type semiconductor package 100-1 according to an example embodiment.

In FIG. 4, the same reference numerals denote the same elements in FIGS. 1 to 3. The film-type semiconductor package 100-1 may correspond to the film-type semiconductor package 100 of FIGS. 1 to 3. The film-type semiconductor package 100-1 may further include an electronic element 232, a support plate 234, connectors 236 and 238, and an underfill layer 240.

The film-type semiconductor package 100-1 may include a metal lead portion 130 arranged on a film substrate 110 and a resist layer 132 arranged on the metal lead portion 130 so as to expose a portion of the metal lead portion 130. Although in FIG. 4, the resist layer 132 is arranged only above an upper surface of the film substrate 110, an additional resist layer may be arranged on a lower surface of the film substrate 110. The semiconductor chip 210 and the electronic element 232 may be mounted on the metal lead portion 130.

The semiconductor chip 210 may be bonded to the metal lead portion 130 through the bump 230 including the soldering portion 230f. The semiconductor chip 210 may protect the bump 230 with the underfill layer 240 arranged on the film substrate 110. The electronic element 232 may be bonded to the metal lead portion 130 by an adhesive layer 242. The electronic element 232 may be configured to perform various functions as a surface mount device. The electronic element 232 may include, for example, an active element, a passive element, and a semiconductor chip.

In the film-type semiconductor package 100-1, the connectors 236 and 238 may be respectively arranged at the metal lead portions 130 in opposite end portions, e.g., one end portion and the other end portion, of the film substrate 110 as an outer lead bonding portion OLB. The connectors 236 and 238 may be bonded to the image display panel 550 (refer to FIG. 1) and the source and gate drive PCBs 300 and 400 (refer to FIG. 1). In some example embodiments, the support plate 234 may be arranged on a lower surface of the film substrate 110 to support the film substrate 110 in the film-type semiconductor package 100-1.

Figure 5:
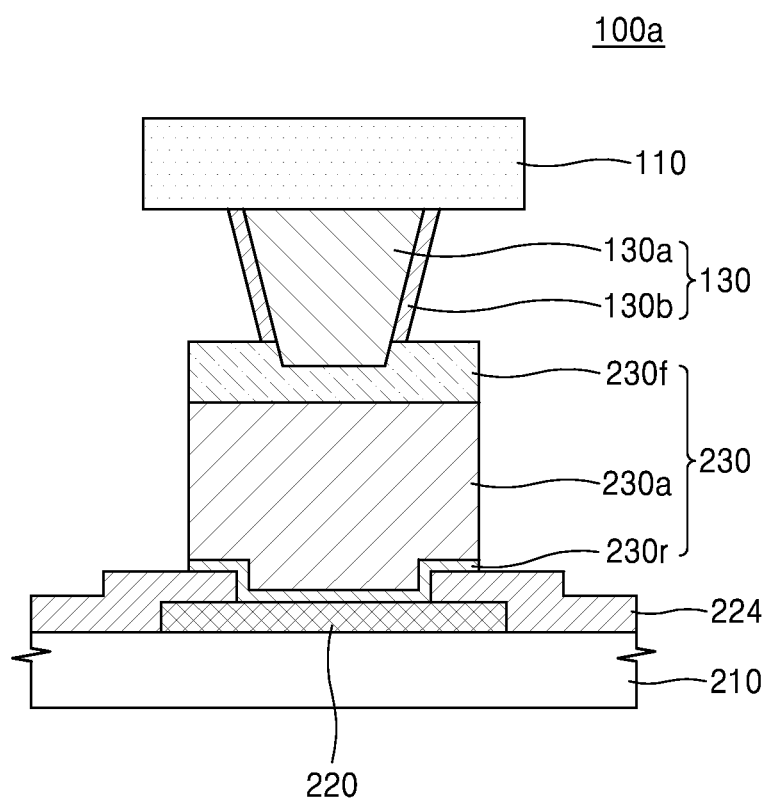
FIG. 5 is a cross-sectional view illustrating a structure of a bump of a film-type semiconductor package according to an example embodiment.

FIG. 5 is a cross-sectional view illustrating a structure of a bump of a film-type semiconductor package according to an example embodiment.

In detail, FIG. 5 illustrates a bump structure in the film-type semiconductor packages 100 and 100-1 of FIGS. 1 to 4 and a connection relation 100a between the film substrate 110 and the pad 220 of the semiconductor chip 210 using the bump 230. In FIG. 5, the same reference numerals denote the same elements illustrated in FIGS. 1 to 4.

The metal lead portion 130 arranged on the film substrate 110 may be connected to the pad 220 of the semiconductor chip 210 via the bump 230. The film-type semiconductor packages 100 and 100-1 illustrated in FIGS. 1 to 4 may be manufactured by bonding the bump 230 arranged on the one surface of the semiconductor chip 210 to the metal leading portion 130 on the film substrate 110.

The bump 230 and the metal lead portion 130 may be bonded to each other by a thermal compression process as described below. In FIG. 5, the film substrate 110 is at a relatively upper position with respect to the bump 230 and/or the metal lead portion 130, and the semiconductor chip 210 is at a relatively lower position with respect to the bump 230 and/or the metal lead portion 130. Accordingly, the metal lead portion 130 and the bump 230 may be bonded to each other by applying pressure and heat to the film substrate 110 using a pressurizing and heating unit.

The metal lead portion 130 may include a metal lead 130a and a lead protective layer 130b protecting a surface of the metal lead 130a. The metal lead 130a may include a copper layer, and the lead protective layer 130b may include a tin layer.

The pad 220 that is protected by a pad protective layer 224 may be disposed on the surface of the semiconductor chip 210. The pad 220 may include the copper layer and the aluminum layer. The pad protective layer 224 may include an insulating layer, e.g., a silicon nitride layer. The bump 230 may be disposed on the pad 220 to be connected to the metal lead portion 130.

The bump 230 may be arranged above the pad 220 and may include a metal pillar 230a including a first metal, e.g., gold or copper. The bump 230 may include the soldering portion 230f arranged over an entire surface of the metal pillar 230a, bonded to the metal lead portion 130, and containing a second metal, e.g., tin, which may be different from the first metal. In other words, the bump 230 may include the metal pillar 230a arranged above the pad 220 and the soldering portion 230f arranged over the entire surface of the metal pillar 230a and bonded to the metal lead portion 130.

The metal pillar 230a may include a first gold layer and a copper layer. The metal pillar 230a may include a gold layer having low reactivity or low mutual atomic diffusivity with respect to the soldering portion 230f. The bump 230, if necessary, may further include a barrier layer 230r arranged on the pad 220. The barrier layer 230r may facilitate forming the metal pillar 230a on the pad 220. The barrier layer 230r may include a metal layer, e.g., a titanium layer, a titanium nitride layer, etc.

The soldering portion 230f may include a gold-tin eutectic alloy layer including the first metal and the second metal as described above. As described below, the soldering portion 230f may include the gold-tin eutectic alloy layer obtained by alloying a second solder layer, e.g., a gold layer, and a first solder layer, e.g., a tin layer having a melting point that is lower than the melting point of the gold layer. The gold-tin eutectic alloy layer contains tin atoms of about 25 at % to about 45 at %. The soldering portion 230f may surround a bottom surface and opposite side surfaces of the metal lead portion 130.

Figure 12:
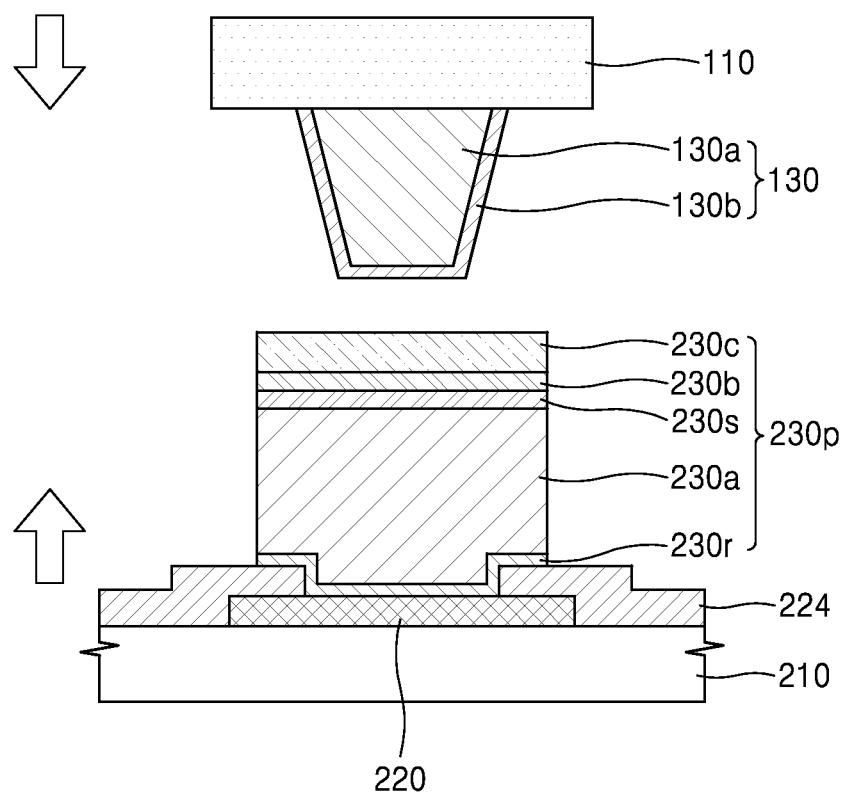

The bump 230 may further include the second soldering layer, e.g., the gold layer, and the first solder layer, e.g., the tin layer having a lower melting point than the melting point of the second solder layer in addition to the soldering portion 230f in order to lower compression pressure and a compression temperature of the pressurizing and heating unit during the thermal compression process connecting the metal lead portion 130 to the bump 230 (or a preliminary bump 230p of FIG. 12).

Accordingly, the metal lead portion 130 and the pad 220 of the film-type semiconductor packages 100 and 100-1 may be reliably connected to each other through the bump 230. In addition, the film-type semiconductor packages 100 and 100-1 may lower the compression pressure and the compression temperature of the pressurizing and heating unit during the thermal compression process connecting the metal lead portion 130 to the bump 230, and thus bending of the film substrate 110 may be reduced or prevented.

Figure 6:
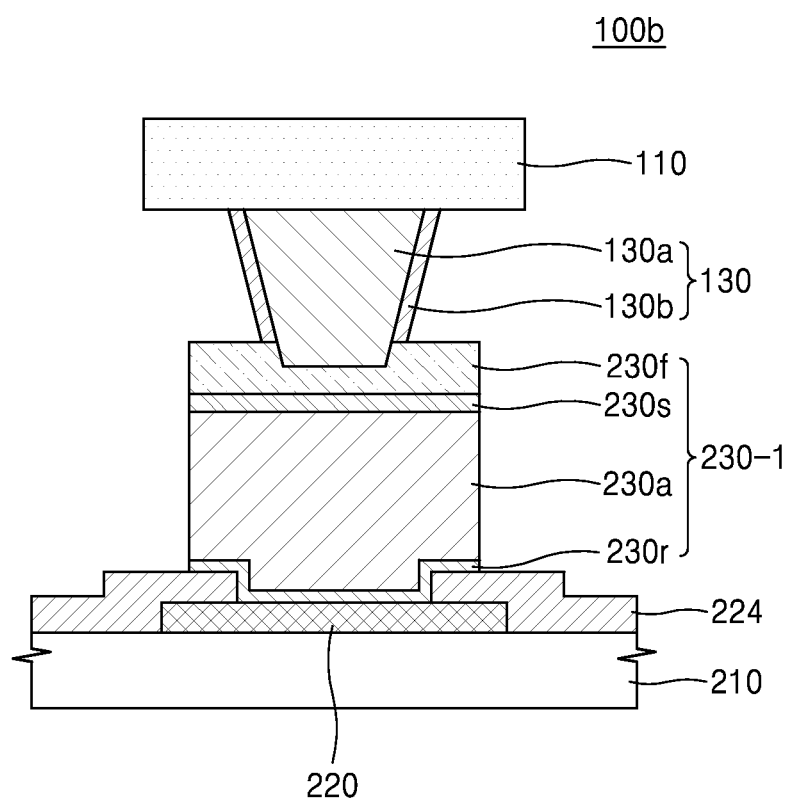
FIG. 6 is a cross-sectional view illustrating a structure of a bump of a film-type semiconductor package according to an example embodiment.

FIG. 6 is a cross-sectional view illustrating a structure of a bump of a film-type semiconductor package according to an example embodiment.

In detail, FIG. 6 illustrates a bump structure in the film-type semiconductor packages 100 and 100-1 of FIGS. 1 to 4 and a connection relation 100b between the film substrate 110 and the pad 220 of the semiconductor chip 210 using a bump 230-1. In FIG. 6, the same reference numerals denote the same elements in FIGS. 1 to 5.

The connection relation 100b between the film substrate 110 and the pad 220 of the semiconductor chip 210 of FIG. 6 may have the same structure as the structure of the connection relation 100a of FIG. 5 except that the bump 230-1 further includes a diffusion preventing layer 230s. Detailed descriptions of the same elements will be omitted in order to avoid redundancy.

The bump 230-1 may connect the metal lead portion 130 arranged on the film substrate 110 to the pad 220 of the semiconductor chip 210. The bump 230-1 may include a metal pillar 230a arranged on the pad 220 and including a first metal, e.g., gold or copper, the diffusion preventing layer 230s arranged on the metal pillar 230a and including a third metal, e.g., nickel, and a soldering portion 230f arranged over an entire surface of the diffusion preventing layer 230s, bonded to the metal lead portion 130, and including the first metal and a second metal that is different from the first or third metal, e.g., tin.

The metal pillar 230a may include a gold layer or a copper layer. The diffusion preventing layer 230s may include a metal layer having a higher melting point than a melting point of tin in the soldering portion 230f. The diffusion preventing layer 230s may include a nickel layer.

The diffusion preventing layer 230s may hinder or prevent elements constituting the metal pillar 230a, such as copper, from exerting an influence on the soldering portion 230f after being diffused. When the diffusion preventing layer 230s is formed as illustrated in FIG. 6, the metal pillar 230a may include a copper layer because the reactivity or the mutual atomic diffusivity of the metal pillar 230a with respect to the soldering portion 230f may not be considered.

Figure 7:
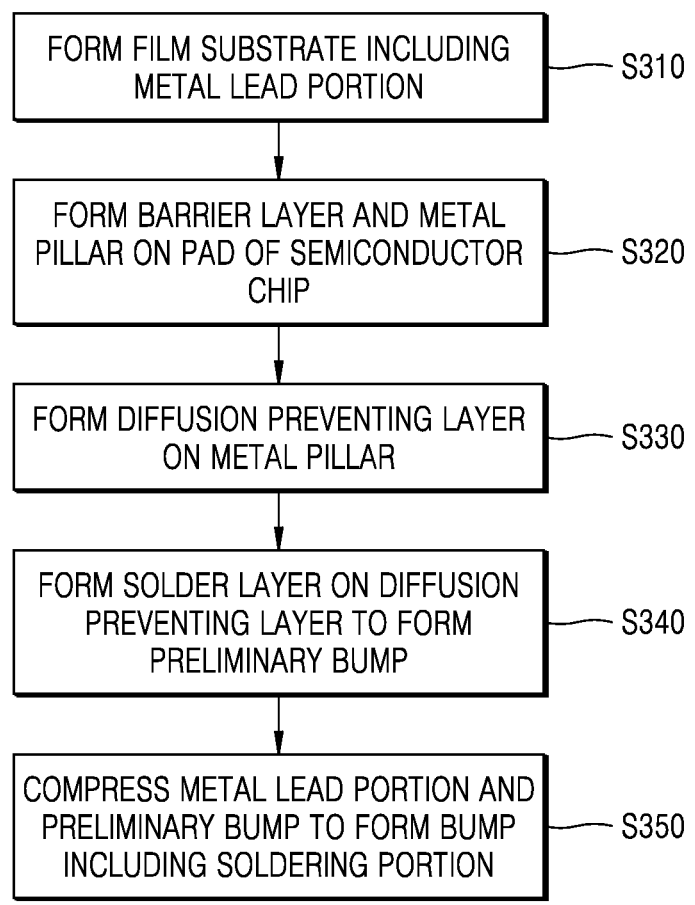
FIG. 7 is a flowchart illustrating a method of manufacturing a film-type semiconductor package according to an example embodiment.

FIG. 7 is a flowchart illustrating a method of manufacturing a film-type semiconductor package according to an example embodiment, and FIGS. 8 to 12 are cross-sectional views illustrating a method of manufacturing a film-type semiconductor package according to an example embodiment.

Figure 8:
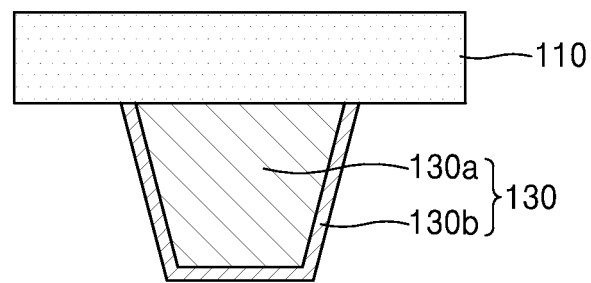
FIGS. 8 to 12 are cross-sectional views illustrating a method of manufacturing a film-type semiconductor package according to an example embodiment.

In detail, as illustrated in FIGS. 7 and 8, the manufacturing method of the film-type semiconductor package includes forming the film substrate 110 including the metal lead portion 130 (S310). The metal lead portion 130 is formed on a surface of the film substrate 110. As described above, the metal lead portion 130 includes the metal lead 130a, e.g., the copper layer, and the lead protective layer 130b, e.g., the tin layer.

Figure 9:
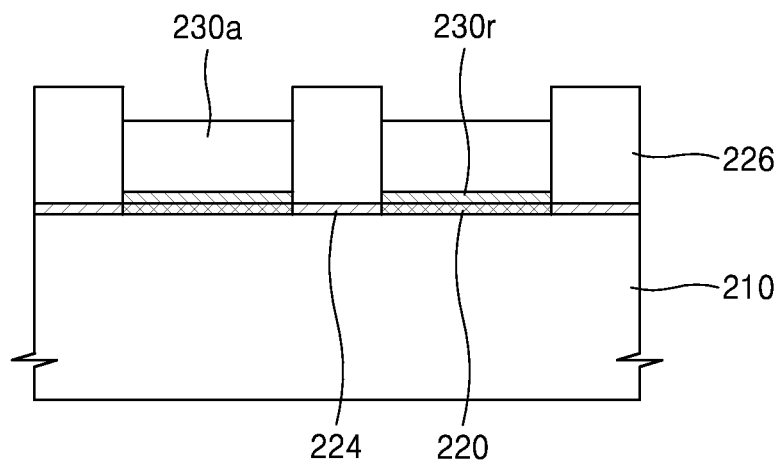

As illustrated in FIGS. 7 and 9, the barrier layer 230r and the metal pillar 230a are formed on the pad 220 of the semiconductor chip 210 (S320). The pad 220 may be restricted by the pad protective layer 224. The barrier layer 230r may also be formed, if necessary.

The barrier layer 230r may include a metal layer, e.g., the titanium layer or the titanium nitride layer as described above. The metal pillar 230a may include a gold layer or a copper layer. The barrier layer 230r and the metal pillar 230a may be aligned with the pad 220. In other words, the barrier layer 230r and the metal pillar 230a may be formed on the pad 220 restricted by a mask layer 226 formed on the semiconductor chip 210.

Figure 10:
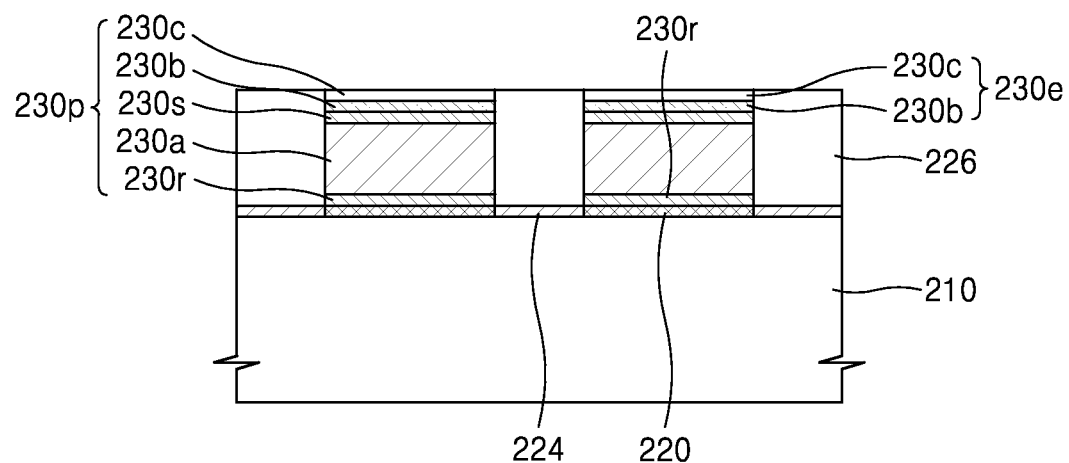
Figure 11:
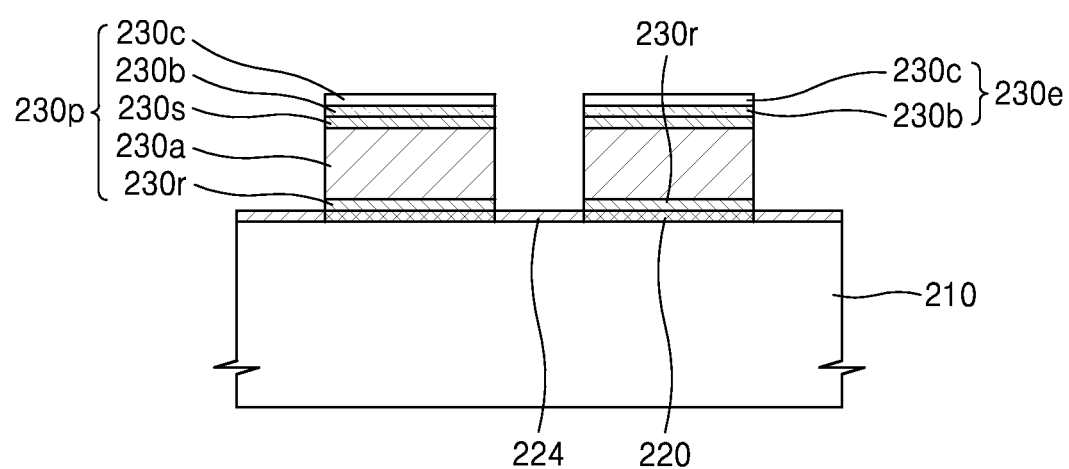

As illustrated in FIGS. 7, 10, and 11, the diffusion preventing layer 230s is formed on the metal pillar 230a (S330). As described above, the diffusion preventing layer 230s may be formed as needed. For example, the diffusion preventing layer 230s may include a nickel layer.

A solder layer 230e may be formed, for example subsequently formed, on the diffusion preventing layer 230s (S340). The solder layer 230e may include the first solder layer 230b formed on the diffusion preventing layer 230s and the second solder layer 230c formed on the first solder layer 230b.

The first solder layer 230b may include a metal layer having a melting point lower than the melting point of the second solder layer 230c. The first solder layer 230b may include a tin layer. The second solder layer 230c may include a gold layer. The preliminary bump 230p configured to include the barrier layer 230r, the metal pillar 230a, the first solder layer 230b, and the second solder layer 230c may be formed on the pad 220 by the above-mentioned processes, as illustrated in FIG. 10.

The barrier layer 230r, the metal pillar 230a, the first solder layer 230b, and the second solder layer 230c, which are described above, may be formed by various methods, such as, for example, a thermal deposition method, an electron-beam deposition method, a sputter method, an electroplating method, an electroless plating method, etc.

When the mask layer 226 (refer to FIG. 10) is removed, the preliminary bump 230p may be completed as illustrated in FIG. 11. The preliminary bump 230p may be provided in a state where the preliminary bump 230p is electrically connected to the pad 220 of the semiconductor chip 210.

Referring to FIGS. 5, 6, 7, and 12, the metal lead portion 130 and the preliminary bump 230p may be thermally compressed to form a eutectic alloy layer, thereby forming the bumps 230 and 230-1 (refer to FIGS. 5 and 6) having the soldering portion 230f (refer to FIGS. 5 and 6) (S350). FIG. 12 illustrates a state where the film substrate 110 including the metal lead portion 130 is separated from the semiconductor chip 210 on which the preliminary bump 230p is formed.

The preliminary bump 230p may be used to describe the state in which the semiconductor chip 210 is not bonded to the metal lead portion 130, and the preliminary bump 230p may be a bump as a general concept. The preliminary bump 230p may be formed to have a three-layer structure including the metal pillar 230a, the first solder layer 230b, and the second solder layer 230c. The preliminary bump 230p may be formed to have a four-layer structure of the metal pillar 230a, the diffusion preventing layer 230s, the first solder layer 230b, and the second solder layer 230c.

The thermal compression process for the metal lead portion 130 and the preliminary bump 230p may be a process of bonding the metal lead portion 130 to the preliminary bump 230p by applying pressure and heat to the film substrate 110 and to the preliminary bump 230p via the pressurizing and heating unit. The soldering portion 230f (refer to FIGS. 5 and 6) may be formed by melting the first solder layer 230b and the second solder layer 230c, which results in the forming of the eutectic alloy layer.

Due to the thermal compression process for the metal lead portion 130 and the preliminary bump 230p, the eutectic alloy layer is formed after the metal lead portion 130 and the preliminary bump 230p make contact with each other via the pressurizing and heating unit, as illustrated by the arrows of FIG. 12.

For instance, the bonding process may be performed by applying a pressure of about 10 kgf/cm$^2$ to about 20 kgf/cm$^2$ to the film substrate 110 and the preliminary bump 230p at a temperature of about 300° C. to about 400° C. for a period of time of several seconds to several tens of seconds. However, the above-mentioned example bonding process conditions may be changed, and other bonding conditions may be used that result in having the metal lead portion 130 and the preliminary bump 230p bonded to each other by forming a eutectic alloy layer.

To more easily form the eutectic alloy layer, the soldering portion 230f (refer to FIGS. 5 and 6) may include a gold-tin eutectic alloy layer obtained by alloying the second solder layer 230c, e.g., the gold layer, and the first solder layer 230b, e.g., the tin layer having a melting point lower than the melting point of the gold layer. The gold-tin eutectic alloy layer contains tin atoms of about 25 at % to about 45 at %.

Figure 13:
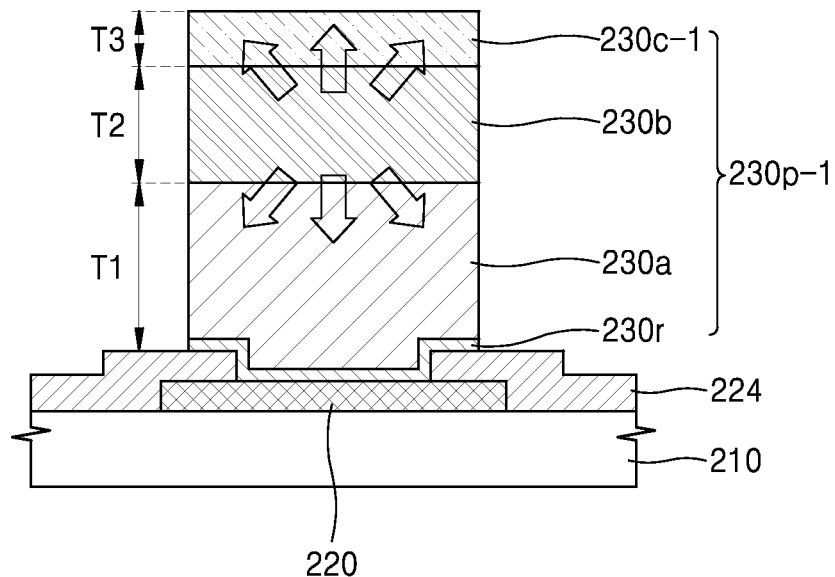
FIGS. 13 and 14 are cross-sectional views illustrating a configuration of a preliminary bump prepared for manufacturing a film-type semiconductor package according to an example embodiment.
Figure 14:
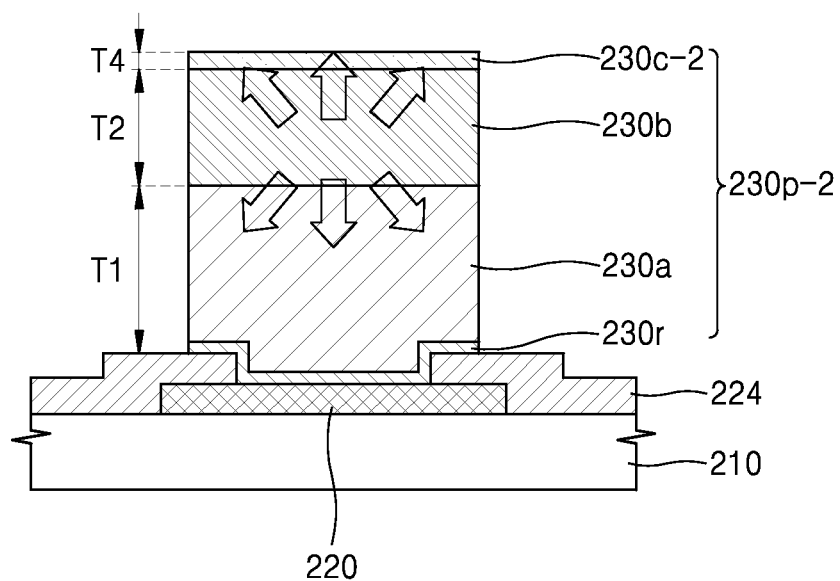

FIGS. 13 and 14 are cross-sectional views illustrating a configuration of a preliminary bump prepared for manufacturing a film-type semiconductor package according to an example embodiment.

In some example embodiments, as described above, a preliminary bump 230p-1 or a preliminary bump 230p-2 may be formed on the pad 220 when the film-type semiconductor package is manufactured, the preliminary bump 230p-1 including a barrier layer 230r, a metal pillar 230a, a first solder layer 230b, and a second solder layer 230c-1, and the preliminary bump 230p-2 including a barrier layer 230r, a metal pillar 230a, a first solder layer 230b, and a second solder layer 230c-2. The second solder layer 230c-1 of the preliminary bump 230p-1 illustrated in FIG. 13 may have a thickness T3 that is different from a thickness T4 of the second solder layer 230c-2 of the preliminary bump 230p-2 illustrated in FIG. 14.

The metal pillar 230a may have a thickness T1 of about several tens of micrometers (μm). The first solder layer 230b may have a thickness T2 of about several micrometers (μm). The thickness T2 of the first solder layer 230b illustrated in FIG. 13 may be greater than the thickness T3 of the second solder layer 230c-1.

The thickness T3 of the second solder layer 230c-1 illustrated in FIG. 13 may correspond to about 50% of the thickness T2 of the first solder layer 230b. A thickness T2 of the first solder layer 230b illustrated in FIG. 14 may be greater than the thickness T4 of the second solder layer 230c-2. The thickness T4 of the second solder layer 230c-2 illustrated in FIG. 14 may correspond to about 10% to about 30% of the thickness T2 of the first solder layer 230b.

In FIGS. 13 and 14, when the metal lead portion 130 and the preliminary bumps 230p-1 and 230p-2 are thermally compressed, solder atoms, e.g., the tin atoms, in the first solder layer 230b in the preliminary bumps 230p-1 and 230p-2 may form a solid solution in the metal pillar 230a and the second solder layers 230c-1 and 230c-2, as illustrated by the arrows in FIGS. 13 and 14, and thus the soldering portion 230f (refer to FIG. 5) may be formed.

As described above, the metal pillar 230a may be thicker than the first solder layer 230b. The thickness T2 of the first solder layer 230b may be greater than the thickness T3 of the second solder layer 230c-1 and the thickness T4 of the second solder layer 230c-2. In this case, the soldering portion 230f (refer to FIG. 5) may be formed by the thermal compression process of the metal lead portion 130 and the preliminary bumps 230p-1 and 230p-2.

Figure 15:
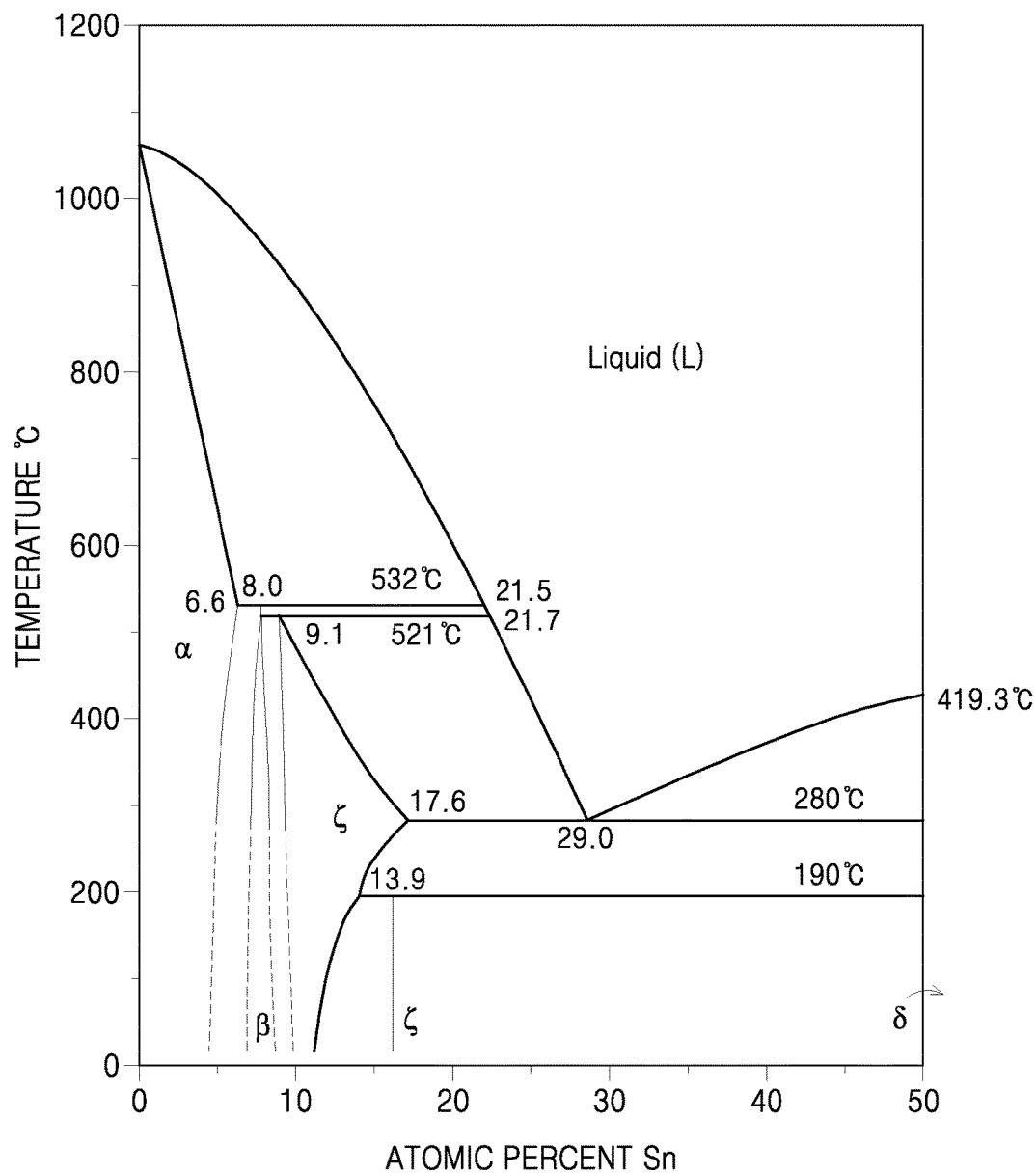
FIG. 15 is a phase diagram of elements constituting a solder layer of a film-type semiconductor package according to an example embodiment.

FIG. 15 is a phase diagram of elements constituting a solder layer of a film-type semiconductor package according to an example embodiment.

In detail, FIG. 15 illustrates the phase diagram of the solder layer of the example film-type semiconductor package described above, e.g., the gold-tin eutectic alloy layer. As described with reference to FIG. 12, the soldering portion 230f (refer to FIGS. 5 and 6) may be formed via the thermal compression process performed on the metal lead portion 130 and the preliminary bump 230p.

The preliminary bump 230p (refer to FIG. 12) may include the first solder layer 230b (refer to FIG. 12), e.g., tin layer, and the second solder layer 230c (refer to FIG. 12), e.g., the gold layer. The soldering portion 230f (refer to FIGS. 5 and 6) may include a gold-tin eutectic alloy layer through a eutectic reaction of the first solder layer 203b and the second solder layer 230c.

As illustrated in FIG. 15, a point at which the eutectic reaction occurs when a temperature is about 280° C. and the tin atoms in the gold-tin alloy is about 29.0 at %, may be called a eutectic point. When the temperature is equal to or less than about 280° C. and the content of tin atoms in the gold-tin alloy is equal to or greater than about 17 at % and equal to or less than about 50 at %, the gold-tin alloy may be present in a zeta phase. When the temperature is equal to or less than about 280° C. and the content of tin atoms in the gold-tin alloy is equal to or greater than about 50 at %, the gold-tin alloy may be present in a delta phase.

On the basis of the above, when the thermal compression process is performed on the metal lead portion 130 and the preliminary bump 230p, the content of tin atoms in the gold-tin solder layer may be maintained between about 25 at % and about 45 at %, and the compression (bonding) temperature may be maintained between about 300° C. and about 400° C. In addition, the compression pressure (bonding pressure) may be maintained between about 10 kgf/cm$^2$ and about 20 kgf/cm$^2$, and the compression (bonding) process is performed during several seconds to several tens of seconds. The gold-tin solder layer forms a solid solution by the compression (bonding) process, and thus the gold-tin eutectic alloy layer may be formed.

According to the film-type semiconductor package, the compression (bonding) temperature and the pressure may be lowered by the above-mentioned compression (bonding) process when the preliminary bump 230p including the metal pillar 230a and the solder layers 230b and 230c are thermally compressed. In addition, bending of the film substrate 110 (refer to FIG. 12) of the film-type semiconductor package may be reduced or prevented, and the gold-tin eutectic alloy layer may be easily formed.

Figure 16:
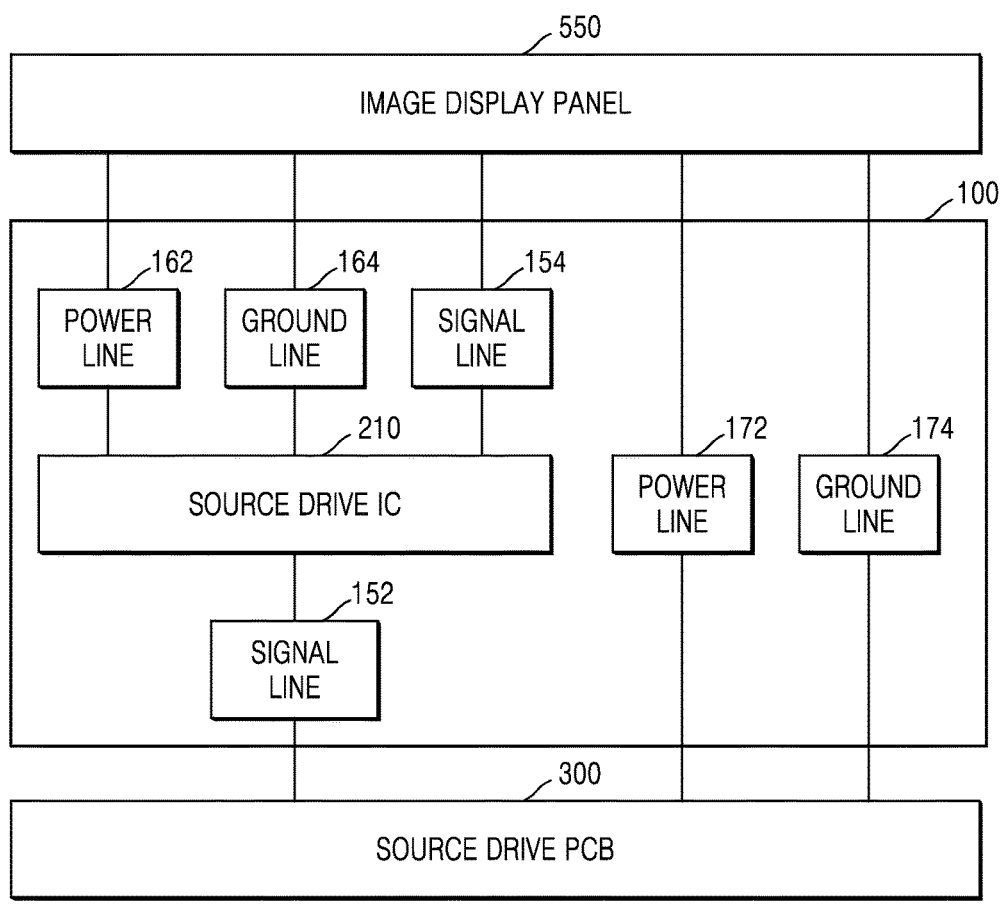
FIG. 16 is a block diagram illustrating a configuration of a display device including a film-type semiconductor package according to an example embodiment.

FIG. 16 is a block diagram illustrating a configuration of a display device including a film-type semiconductor package according to an example embodiment.

Referring to FIG. 16, a flat panel display device 500 may include the image display panel 550 and the source drive PCB 300 applying a driving signal to the image display panel 550 through the film-type semiconductor package 100. The image display panel 550 may include, for example, a liquid crystal display panel.

Although not illustrated in the figures, the source drive PCB 300 may include a power unit, a memory unit, a program unit, and a buffer unit, which are built therein. The power provided to the power unit of the source drive PCB 300 from an external power supply source is applied to circuits, such as the memory unit, the program unit, and the buffer unit of the source drive PCB 300. The power unit of the source drive PCB 300 applies a power source voltage to the image display panel 550 through a power line 172 of the film-type semiconductor package 100 to display an image.

The semiconductor chip 210, such as a source drive IC, is mounted on the film-type semiconductor package 100 to apply the driving signal to the image display panel 550 from the source drive PCB 300. As described above, the power source voltage and operation signals for display of the image display panel 550 are transmitted to the image display panel 550 through the film substrate 110 (refer to FIG. 2) and the semiconductor chip 210, such as the source drive IC, mounted on the film substrate 110.

A signal line 152 is connected between the source drive PCB 300 and the semiconductor chip 210 on the film-type semiconductor package 100. The signal line 152 may constitute an input circuit. A signal line 154 is formed between the semiconductor chip 210 and the image display panel 550 on the film-type semiconductor package 100. The signal line 154 may constitute an output circuit.

The power line 172 and a ground line 174 are connected between the source drive PCB 300 and the semiconductor chip 210 on the film-type semiconductor package 100. A power line 162 and a ground line 164 are formed between the semiconductor chip 210 and the image display panel 550 on the film-type semiconductor package 100. The power lines 162 and 172 and the ground lines 164 and 174 are prepared to apply power to the image display panel 550.

While the inventive concepts have been described in connection with the example embodiments, it is to be understood by those who skilled in the art that the inventive concepts are not limited to the disclosed example embodiments, but, on the contrary, are intended to cover various modifications, substitutions, and equivalent arrangements included within the spirit and scope of the appended claims. The example embodiments may be constructed and/or utilized independently or in combination with any other example embodiment contained herein.

Therefore, the disclosed subject matter should not be limited to any single example embodiment described herein, and the above-described example embodiments are to be considered illustrative and not restrictive. Accordingly, the scope of the inventive concepts shall be determined only according to the attached claims.

What is claimed is:

1. A film-type semiconductor package comprising:
   a metal lead portion on a film substrate;
   a semiconductor chip including a pad; and
   a bump connecting the metal lead portion to the pad of the semiconductor chip, the bump including,
      a metal pillar on the pad and including a first metal; and
      a soldering portion on an entire surface of the metal pillar, bonded to the metal lead portion, and including the first metal and a second metal that is different from the first metal the soldering portion having a top surface that is substantially flat; and
   wherein the metal lead portion comprises a metal lead and a lead protective layer protecting a surface of the metal lead, and a lower surface of the metal lead portion is below and within the top surface of the soldering portion;
   the metal lead includes a copper layer, and
   the lead protective layer includes a tin layer.

2. The film-type semiconductor package of claim 1, wherein the metal pillar comprises a gold layer or a copper layer.

3. The film-type semiconductor package of claim 1, wherein the soldering portion comprises a gold-tin eutectic alloy layer.

4. The film-type semiconductor package of claim 3, wherein a content of tin atoms in the gold-tin eutectic alloy layer is equal to or greater than about 25% and equal to or less than about 45%.

5. The film-type semiconductor package of claim 1, wherein the soldering portion surrounds a bottom and opposite side surfaces of the metal lead portion.

6. The film-type semiconductor package of claim 1, wherein a diffusion preventing layer includes a third metal that is different from the first metal and the second metal.

7. The film-type semiconductor package of claim 6, wherein the diffusion preventing layer comprises a nickel layer.

8. A film-type semiconductor package comprising:
   a metal lead portion extending from an outer lead bonding portion at one side portion of a film substrate to an inner lead bonding portion;
   a semiconductor chip including a pad; and
   a bump connecting the metal lead portion of the inner lead bonding portion to the pad of the semiconductor chip, the bump including,
      a metal pillar on the pad and including a first metal; and
      a soldering portion on an entire surface of the metal pillar, bonded to the metal lead portion, and including the first metal and a second metal that is different from the first metal the soldering portion having a top surface that is substantially flat; wherein
   the metal lead portion includes a metal lead and a lead protective layer protecting a surface of the metal lead, and a lower surface of the metal lead portion is below and within the top surface of the soldering portion;
   the metal lead includes a copper layer, and
   the lead protective layer includes a tin layer.

9. The film-type semiconductor package of claim 8, wherein the outer lead bonding portion comprises a connection portion bonded to an image display panel or a printed circuit board.

10. The film-type semiconductor package of claim 8, wherein:
    the metal pillar includes a gold layer or a copper layer, and
    the soldering portion includes a gold-tin eutectic alloy layer.

11. The film-type semiconductor package of claim 10, wherein a content of tin atoms in the gold-tin eutectic alloy layer is equal to or greater than about 25 at % and equal to or less than about 45 at %.

12. The film-type semiconductor package of claim 8, further comprising:
    a diffusion preventing layer on the metal pillar, the diffusion preventing layer including a nickel layer.

13. The film-type semiconductor package of claim 8, further comprising:
    a barrier layer between the pad and the metal pillar.

14. A bonding bump bonded to a lead portion in a semiconductor package, the bonding bump comprising:
- a metal pillar including a first metal; and
- a soldering portion including a first soldering layer on the metal pillar, the soldering portion being bonded to the lead portion and including a eutectic alloy layer of the first metal including a second metal, the soldering portion having a top surface that is substantially flat; wherein
  - the lead portion includes a metal lead and a lead protective layer protecting a surface of the metal lead, and a lower surface of the metal lead is below and within the top surface of the soldering portion,
  - the metal lead includes a copper layer, and
  - the lead protective layer includes a tin layer.

15. The bonding bump of claim 14, wherein:
the soldering portion further comprises a second soldering layer; and
a melting point of the first soldering layer is lower than the melting point of the second soldering layer.

16. The bonding bump of claim 14, wherein:
the first metal includes at least one of gold and copper; and
the second metal includes tin.

17. The semiconductor package of claim 14, further comprising a diffusion preventing layer between the soldering portion and the pillar, the diffusion preventing layer including a third metal having a higher melting point than at least one of the first metal and the second metal.

* * * * *